United States Patent
Aubuchon et al.

(10) Patent No.: US 9,779,953 B2
(45) Date of Patent: Oct. 3, 2017

(54) ELECTROMAGNETIC DIPOLE FOR PLASMA DENSITY TUNING IN A SUBSTRATE PROCESSING CHAMBER

(71) Applicant: APPLIED MATERIALS, INC., Santa Clara, CA (US)

(72) Inventors: Joseph F. Aubuchon, San Jose, CA (US); Tza-Jing Gung, San Jose, CA (US); Samer Banna, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 186 days.

(21) Appl. No.: 14/491,729

(22) Filed: Sep. 19, 2014

(65) Prior Publication Data

US 2015/0087157 A1 Mar. 26, 2015

Related U.S. Application Data

(60) Provisional application No. 61/882,407, filed on Sep. 25, 2013.

(51) Int. Cl.
| | | |
|---|---|---|
| H01L 21/306 | (2006.01) | |
| H01L 21/3065 | (2006.01) | |
| H01J 37/32 | (2006.01) | |

(52) U.S. Cl.
CPC ...... *H01L 21/3065* (2013.01); *H01J 37/3211* (2013.01); *H01J 37/32669* (2013.01)

(58) Field of Classification Search
CPC ............... H01J 37/32669; H05H 2001/4652
USPC ....... 156/345.42, 345.46, 345.49; 216/68, 70
See application file for complete search history.

(56) References Cited

U.S. PATENT DOCUMENTS

| 6,673,199 B1 | 1/2004 | Yamartino et al. | |
|---|---|---|---|
| 2009/0220865 A1* | 9/2009 | Ouye | H01J 37/321 430/5 |
| 2010/0243162 A1* | 9/2010 | Koshimizu | H01J 37/32091 156/345.28 |
| 2013/0087288 A1* | 4/2013 | Sakka | H01J 37/32651 156/345.48 |
| 2013/0106286 A1* | 5/2013 | Banna | H05H 1/46 315/111.21 |

(Continued)

OTHER PUBLICATIONS

Wikipedia, the Free Encyclopedia, "Magnetic Dipole" via https://web.archive.org/web/20130906190106/http://en.wikipedia.org/wiki/Magnetic_dipole ; 2 pages; 2013.*

(Continued)

*Primary Examiner* — Binh X Tran
(74) *Attorney, Agent, or Firm* — Moser Taboada; Alan Taboada

(57) ABSTRACT

Methods and apparatus for plasma-enhanced substrate processing are provided herein. In some embodiments, an apparatus for processing a substrate includes: a process chamber having an internal processing volume disposed beneath a dielectric lid of the process chamber; a substrate support disposed in the process chamber; two or more concentric inductive coils disposed above the dielectric lid to inductively couple RF energy into the processing volume above the substrate support; and an electromagnetic dipole disposed proximate a top surface of the dielectric lid between two adjacent concentric inductive coils of the two or more concentric inductive coils.

5 Claims, 2 Drawing Sheets

(56) References Cited

U.S. PATENT DOCUMENTS

2014/0209244 A1 7/2014 Banna et al.
2014/0273304 A1 9/2014 De Gorordo et al.

OTHER PUBLICATIONS

Final Answers; "Electromagnetic Dipoles", via http://www.numericana.com/answer/dipole.htm ; 9 pages; 2008.*

* cited by examiner

ELECTROMAGNETIC DIPOLE FOR PLASMA DENSITY TUNING IN A SUBSTRATE PROCESSING CHAMBER

CROSS-REFERENCE TO RELATED APPLICATIONS

This application claims benefit of U.S. provisional patent application Ser. No. 61/882,407, filed Sep. 25, 2013, which is herein incorporated by reference.

FIELD

Embodiments of the present disclosure generally relate to plasma-enhanced substrate processing in a substrate processing chamber.

BACKGROUND

In some dual coil inductively coupled plasma (ICP) chambers, a plasma density may show contribution from each of the coils in the areas between the source coils (either constructive or destructive). While the process can be tuned using various techniques, there are certain fundamental signatures that result from generating plasma from conventional dual coil sources, such as the characteristic "m-shape" plasma density (and resultant on-substrate effects) observed in some processes, such as a silicon (Si) etch process for example.

Thus, the inventors have provided apparatus and methods that enable tuning of the plasma density so that issues such as the "m-shape" limitation can be addressed.

SUMMARY

Methods and apparatus for plasma-enhanced substrate processing are provided herein. In some embodiments, an apparatus for processing a substrate includes: a process chamber having an internal processing volume disposed beneath a dielectric lid of the process chamber; a substrate support disposed in the process chamber; two or more concentric inductive coils disposed above the dielectric lid to inductively couple RF energy into the processing volume above the substrate support; and an electromagnetic dipole disposed proximate a top surface of the dielectric lid between two adjacent concentric inductive coils of the two or more concentric inductive coils.

In some embodiments, methods for processing a substrate in a process chamber having an electromagnetic dipole disposed between two concentric inductive coils proximate a top surface of a dielectric lid of the process chamber are provided. In some embodiments, a method for processing a substrate includes: providing a first current having a first magnitude to a first electromagnetic coil of the electromagnetic dipole; providing a second current having a second magnitude to a second electromagnetic coil of the electromagnetic dipole, wherein the second electromagnetic coil is disposed radially outward of the first electromagnetic coil at a first distance, wherein the second current is provided in the opposite direction of the first current; and processing a substrate in the process chamber using a plasma while adjusting an impedance in an area proximate to and below the dielectric lid to enable plasma density tuning, wherein the impedance is adjusted by the electromagnetic dipole by adjusting the first and second current magnitudes.

In some embodiments, a process chamber for processing a substrate includes a dielectric lid, an internal processing volume disposed beneath the dielectric lid, a substrate support disposed in the process chamber, an RF power supply, an RF feed structure coupled to the RF power supply, two or more concentric inductive coils disposed above the dielectric lid to inductively couple RF energy from the RF power supply provided via the RF feed structure into the processing volume above the substrate support, an electromagnetic dipole disposed proximate a top surface of the dielectric lid between two adjacent concentric inductive coils of the two or more concentric inductive coils, and an actuator configured to move the electromagnetic dipole from a first position above the dielectric lid to a second position above the dielectric lid.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
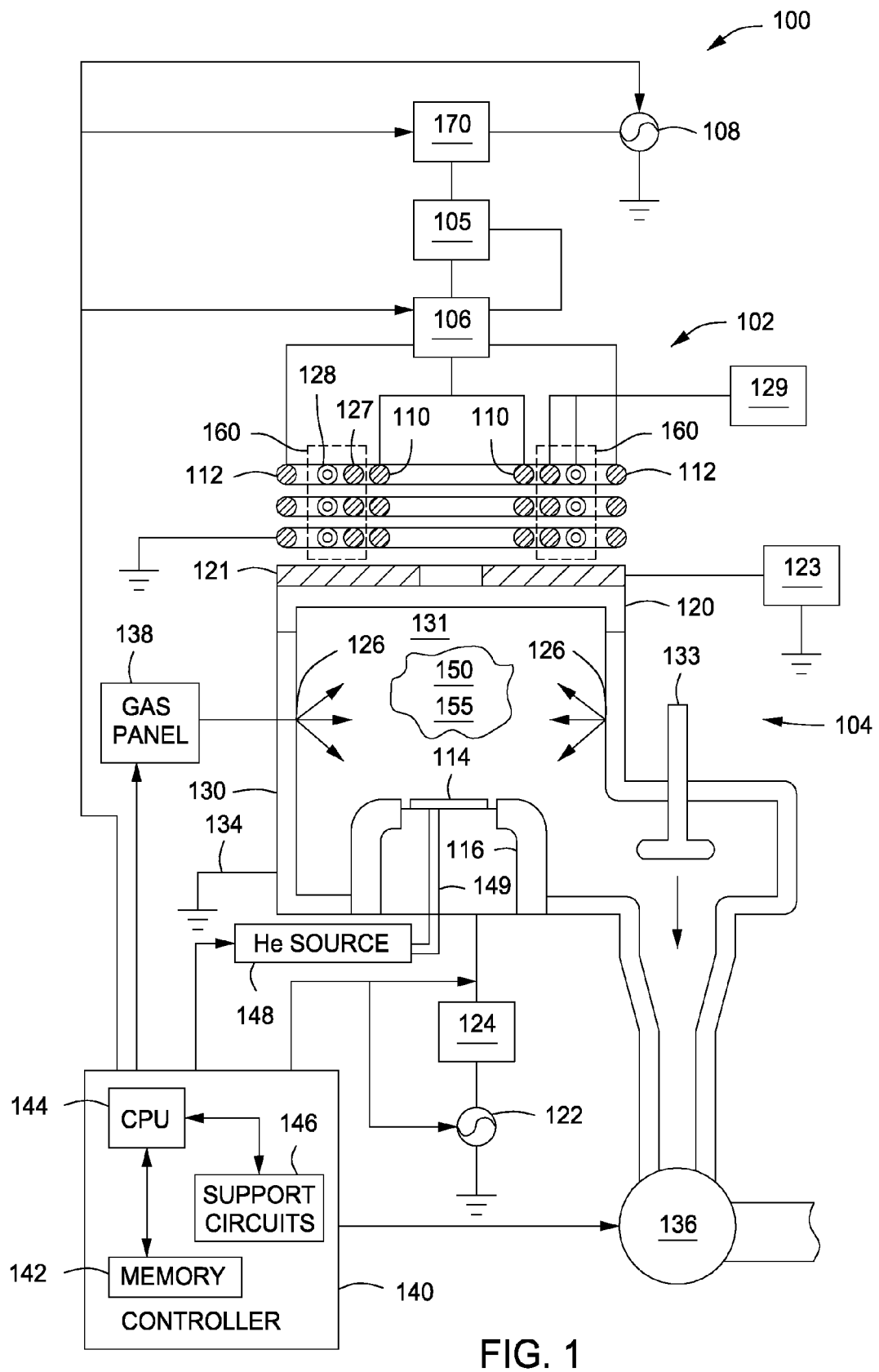
FIG. 1 depicts a schematic side view of an inductively coupled plasma reactor in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present disclosure generally relate to the use of electromagnetic (EM) dipoles for plasma density tuning in a substrate processing chamber and the resulting on-wafer process uniformity.

FIG. 1 depicts a schematic side view of an inductively coupled plasma reactor (reactor 100) in accordance with some embodiments of the present disclosure. The reactor 100 may be utilized alone or, as a processing module of an integrated semiconductor substrate processing system, or cluster tool, such as a CENTURA® integrated semiconductor wafer processing system, available from Applied Materials, Inc. of Santa Clara, Calif. Examples of suitable plasma reactors that may advantageously benefit from modification in accordance with embodiments of the present disclosure include inductively coupled plasma etch reactors such as the DPS® line of semiconductor equipment or other inductively coupled plasma reactors, such as MESA™ or the like also available from Applied Materials, Inc. The above listing of semiconductor equipment is illustrative only, and other etch reactors, and non-etch equipment (such as CVD reactors, or other semiconductor processing equipment) may also be suitably modified in accordance with the present teachings.

The reactor 100 includes an inductively coupled plasma apparatus 102 disposed atop a process chamber 104. The inductively coupled plasma apparatus includes an RF feed structure 106 for coupling an RF power source 108 to a plurality of RF coils, e.g., a first RF coil 110 and a second RF coil 112. The plurality of RF coils are coaxially disposed proximate the process chamber 104 (for example, above the process chamber) and are configured to inductively couple RF power into the process chamber 104 to form or control a plasma from process gases provided within the process chamber 104.

The methods and apparatus of the present disclosure may benefit a reactor configured for standard mode, where RF current flowing along the first RF coil 110 is in-phase with RF current flowing along the second RF coil 112, or dual mode, where the RF current flowing along the first RF coil 110 can be selectively in-phase or out-of-phase with RF current flowing along the second RF coil 112. For example, dual mode ICP sources may be used to eliminate m-shape and improve etch rate (ER) uniformity. For example, the reactor 100 as described herein is configured for dual mode operation.

The RF power source 108 is coupled to the RF feed structure 106 via a match network 170. A power divider 105 may be provided to adjust the RF power respectively delivered to the first and second RF coils 110, 112. The power divider 105 may be coupled between the match network 170 and the RF feed structure 106. Alternatively, the power divider may be a part of the match network 170, in which case the match network will have two outputs coupled to the RF feed structure 106—one corresponding to each RF coil 110, 112. The power divider 105 is discussed in more detail below.

The RF feed structure 106 couples the RF current from the power divider 105 (or the match network 170 where the power divider is incorporated therein) to the respective RF coils. For example, suitable exemplary RF feed structures that may be utilized with the inventive methods disclosed herein may be found in U.S. patent application Ser. No. 12/821,626, filed Jun. 23, 2010 by Z. Chen, et al., and entitled, "RF FEED STRUCTURE FOR PLASMA PROCESSING." In some embodiments, the RF feed structure 106 may be configured to provide the RF current to the RF coils in a symmetric manner, such that the RF current is coupled to each coil in a geometrically symmetric configuration with respect to a central axis of the RF coils, such as by a coaxial structure.

The reactor 100 generally includes the process chamber 104 having a conductive body (wall 130) and a dielectric lid 120 (that together define a processing volume 131), a substrate support pedestal 116 disposed within the processing volume, the inductively coupled plasma apparatus 102, and a controller 140. The wall 130 is typically coupled to an electrical ground 134. In some embodiments, the support pedestal 116 may provide a cathode coupled through a matching network 124 to a RF power source 122. The RF power source 122 may illustratively be a source of up to about 1000 W (but not limited to about 1000 W) at a frequency of approximately 13.56 MHz that is capable of producing either continuous or pulsed power, although other frequencies and powers may be provided for particular applications. In other embodiments, the source 122 may be a DC or pulsed DC source. In some embodiments, the source 122 may be capable of providing multiple frequencies or one or more second sources (not shown) may be coupled to the pedestal 116 through the same matching network 124 or one or more different matching networks (not shown) to provide multiple frequencies.

In some embodiments, a link (not shown) may be provided to couple the RF power source 108 and the RF power source 122 to facilitate synchronizing the operation of one source to the other. Either RF source may be the lead, or master, RF generator, while the other generator follows, or is the slave. The link may further facilitate operating the RF power source 108 and the RF power source 122 in perfect synchronization, or in an offset, or phase difference. The phase control may be provided by circuitry disposed within either or both of the RF source or within the link between the RF sources. This phase control between the source and bias RF generators (e.g., 108, 122) may be provided and controlled independent of the phase control over the RF current flowing in the plurality of RF coils coupled to the RF power source 108.

In some embodiments, the dielectric lid 120 may be substantially flat. Other modifications of the chamber 104 may have other types of lids such as, for example, a dome-shaped lid or other shapes. The inductively coupled plasma apparatus 102 is typically disposed above the lid 120 and is configured to inductively couple RF power into the process chamber 104. The inductively coupled plasma apparatus 102 includes the first and second coils 110, 112, disposed above the dielectric lid 120. The relative position, ratio of diameters of each coil, and/or the number of turns in each coil can each be adjusted to control, for example, the profile or density of the plasma being formed via controlling the inductance on each coil. Each of the first and second coils 110, 112 is coupled through the matching network 170 via the RF feed structure 106, to the RF power source 108. The RF power source 108 may illustratively be capable of producing up to about 4000 W (but not limited to about 4000 W) at a tunable frequency in a range from 50 kHz to 13.56 MHz, although other frequencies and powers may be provided for particular applications.

The first and second RF coils 110, 112 can be configured such that the phase of the RF current flowing through the first RF coil can be out-of-phase with respect to the phase of the RF current flowing through the second RF coil. As used herein with respect to the first and second RF coils 110, 112, the term "out-of-phase" can be understood to mean that the RF current flowing through the first RF coil is flowing in an opposite direction to the RF current flowing through the second RF coil, or that the phase of the RF current flowing through the first RF coil is shifted with respect to the RF current flowing through the second RF coil.

For example, in conventional apparatus, both RF coils are typically wound in the same direction. As such, the RF current is flowing in the same direction in both coils, either clockwise or counterclockwise. The same direction of the winding dictates that the RF current flowing in the two RF coils are always in phase. In embodiments of the present disclosure, RF current may be provided out-of-phase between the two coils by either external means or by physically winding one of the coils in the opposite direction.

In some embodiments, the direction of the RF current flowing through each coil can be controlled by the direction in which the coils are wound. For example, in some embodiments, the first RF coil 110 may be wound in a first direction and the second RF coil 112 may be wound in a second direction which may be opposite the first direction. Accordingly, although the phase of the RF signal provided by the RF power source 108 is unaltered, the opposing winding first and second directions of the first and second RF coils 110, 112 cause the RF current to be out of phase, e.g., to flow in opposite directions effectively producing a 180° phase shift.

Further, additional embodiments of the RF coils are possible, each RF coil need not be a singular continuous coil, and may each be a plurality (e.g., two or more) of interlineated and symmetrically arranged stacked coil elements.

In some embodiments, a power divider 105, such as a dividing capacitor, may be provided between the RF feed structure 106 and the RF power source 108 to control the relative quantity of RF power provided to the respective first and second coils. For example, as shown in FIG. 1, a power divider 105 may be disposed in the line coupling the RF feed structure 106 to the RF power source 108 for controlling the amount of RF power provided to each coil, thus, facilitating control of plasma characteristics in zones corresponding to the first and second coils. In some embodiments, the power divider 105 may be incorporated into the match network 170. In some embodiments, after the power divider 105, RF current flows to the RF feed structure 106 where it is distributed to the first and second RF coils 110, 112. Alternatively, the split RF current may be fed directly to each of the respective first and second RF coils.

During startup of the reactor 100, after a cleaning process or periodically, the reactor 100 may be calibrated so as to insure that setup value of the power divider 105 at the user interface is providing a ratio of RF power to the plurality of RF coils, such as the first and second coils 110, 112 of the reactor 100.

The inventors have observed that in some two or more coil designs, a problem may exist directly below each coil. Specifically, the strongest power coupling may exist directly beneath each coil, and thus a stronger plasma is created immediately below each coil. This means that in a two or more coil design, there may exist one or more separate regions of very strong plasma generation. In a two coil design, for example, the total distribution of the plasma created by the two ICP source coils may be the sum of these two different parts. When these two regions of plasma are added together, there will be areas in between the coils where the interaction of the plasma fields is either constructive or destructive. In typical vertical, two-coil arrangements where the currents are flowing in the same direction (to be denoted as "in phase"), due to the nature of the constructive interference in the electric field between the coils at the substrate level, an m-shaped etch rate profile exists which limits the overall uniformity for advanced node technologies. The location of the peak of the m-shaped etch rate profile in the power coupling under the dielectric window can vary based on the arrangement of the coils or other factors.

The inventors have discovered that by using an electromagnetic dipole to disrupt the power coupling immediately between two adjacent coils, the m-Shaped etch rate profile may advantageously be reduced and substrate uniformity improved. Embodiments of the present disclosure include an electromagnetic dipole 160, which consists of electromagnets (e.g., electromagnetic coils) separated by a gap in radius. In some embodiments, the gap may be between 0.5 inches to about 5 inches, or about 1 inch. The electromagnets may be positioned between any two adjacent source ICP coils. In some embodiments, the electromagnets may be disposed directly on top of the dielectric lid 120. For example, in some embodiments, the electromagnetic dipole 160 may include one or more inner electromagnets 127 (e.g., an inner electromagnetic coil) and one or more outer electromagnets 128 (e.g., an outer electromagnetic coil) concentrically disposed with respect to each other. The electromagnets 127, 128 may be disposed between first and second RF coils 110, 112 to create electromagnetic dipole 160 that forms a magnetic field within the inner volume of the process chamber at or near the lid 120. In a three or more coil design, an electromagnetic dipole 160 may be disposed between any two adjacent RF source coils. In some embodiments, the inner electromagnet 127 and the outer electromagnet 128 may be wound in opposite directions.

By running current in each of the electromagnets 127, 128 in opposite directions, the electromagnets 127, 128 will create magnetic fields that will combine constructively with each other between the electromagnets (and the areas above and below the gap between the electromagnets 127, 128), but the magnetic fields will roughly cancel each other in all of the other areas. Using electromagnetic dipole 160 advantageously creates a magnetic field in the area just below the dielectric lid 120 which will shift the density of the created plasma away from this area and enable plasma density tuning.

The actual power coupling below the dielectric lid 120 depends on several things including the dielectric constant of the dielectric lid 120, the thickness of the dielectric lid 120, the distance between the coils and the dielectric lid 120, and the like. With the magnetic fields produced by electromagnetic dipole 160, the impedance at the dielectric lid 120 can be adjusted to control (1) how the plasma is initially generated, and (2) after the plasma is generated, how the plasma diffuses (i.e., how the movement of charged species will be confined against these magnetic field lines). Thus, electromagnetic dipole 160 disposed between adjacent coils provides the ability to change the impedance locally in a first region near where the plasma is generated (e.g., just beneath the dielectric lid 120), while allowing the plasma to diffuse within the processing volume beyond the first region (e.g., closer to the substrate), so that the distribution of the plasma constituents that reach the substrate are controlled.

In some embodiments, a slightly different opposite current may be run through each of the one or more inner electromagnets 127 and the one or more outer electromagnets 128 of electromagnetic dipole 160. In some embodiments, the difference in opposite currents between the two coils in dipole 160 may be about 0.5 Amps to about 2 Amps, or about 0.5 Amps to about 1 Amp. For example, in some embodiments, about 8 Amps may be run through one or more inner electromagnets 127, and about 8.5 Amps may be run in the opposite direction through one or more outer electromagnets 128. In some embodiments, the currents can vary from few tens of mAmps to a few to tens of Amps.

By running currents in opposite directions and slightly different values, the magnetic fields created beneath the dielectric lid 120 can further be advantageously controlled, thus, further controlling the uniformity at the substrate level. When a slightly different current is run in opposite directions between the two coils 127, 128, the magnetic field formed between the two electromagnetic coils 127, 128 will be similar, but the field outside of the coils will change such that the magnetic field from the electromagnetic coil with the larger magnitude current will contribute more. By controlling which coil has the larger current (and stronger magnetic field effects), the manner in which the generated plasma will diffuse to the wafer can be controlled. The net magnetic field produced by running different currents in opposite directions will become larger if the gap between the electromagnetic coils 127, 128 is increased, and will become smaller if the gap is decreased. In some embodiments, the net magnetic field produced can be controlled by changing the magnitudes of the currents run between the electromagnetic coils 127, 128.

Figure 2:
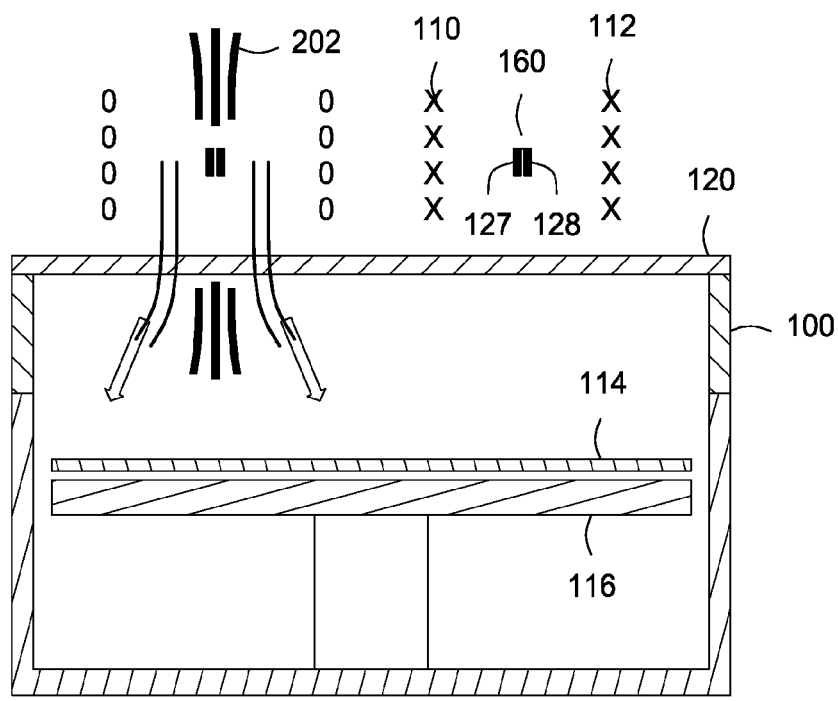
FIG. 2 depicts schematic side views illustrating magnetic field geometries in an inductively coupled plasma reactor in accordance with some embodiments of the present disclosure.

By way of illustration, FIG. 2 depicts a schematic view of the magnetic fields created by electromagnetic dipole 160 and its cumulative effect on a substrate 114. In some embodiments, the position between one or more inner and outer electromagnets 127, 128 of electromagnetic dipole 160, and the current provided to each of one or more inner and outer electromagnets 127, 128 may be controlled to more precisely control the position or geometry of the magnetic field (e.g., 202). The impedance created by electromagnetic dipole 160 pushes plasma generation of the inner coil 110 slightly inward towards the center of the wafer, and plasma generation of the outer coil 112 slightly outward towards the edge of the wafer, thus disrupting the constructive plasma generation effect at the substrate level between the inner and outer coils 110, 112.

In some embodiments, an actuator 129 (shown in FIG. 1) may be coupled to the one or more inner and outer electromagnets 127, 128 to control an axial position of the one or more inner and outer electromagnets 127, 128. The one or more inner and outer electromagnets 127, 128 may be moved, for example, in a range from a position partially above the first and second coils 110, 112. In some embodiments, the one or more inner and outer electromagnets 127, 128 may be moved in a range of about 1 to about 6 inches.

In some embodiments, the one or more inner and outer electromagnets 127, 128 may comprise one or more wires wound repeatedly about a support member that can be coupled to a power source, such as a DC power supply. The wire gauge, number of turns or coils, and current provided may be controlled to provide a magnetic field of the magnitude. In some embodiments, the one or more inner and outer electromagnets 127, 128 of electromagnetic dipole 160 may comprise a plurality of electromagnets arranged about the chamber that together provide the first magnetic field.

Figures 3A, 3B, 3C:
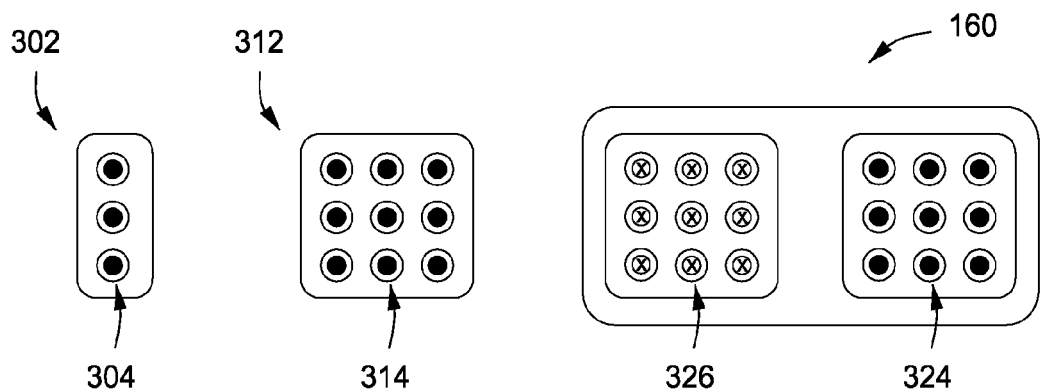
FIGS. 3A-C depict schematic side views of electromagnet coil configurations in accordance with some embodiments of the present disclosure.

For example, as depicted in cross section in FIG. 3A, an electromagnet 302 may comprise a coil 304 of one or more wires wrapped in one layer in the same direction (e.g., having the same polarity). Alternatively, as depicted in cross section in FIG. 3B, an electromagnet 312 may comprise a coil 314 of one or more wires wrapped in a plurality of layers, three layers shown for illustration (e.g., having the same polarity). As depicted in cross section in FIG. 3C, an electromagnet dipole 160 may comprise a first coil 324 (such as inner electromagnet 127) and a second coil 326 (such as outer electromagnet 128) spaced apart from and disposed radially outward of the first coil 324. The spacing between the first and second coils 324, 326 may be selected based upon the magnitude of the electromagnetic field (e.g., the wire gauge, number of turns, current, and the like). In some embodiments, the first and second coils 324, 326 may be spaced apart by about 0.05 inches to about 5 inches, or about 1 inch. The first and second coils 326 may be concentric and substantially co-planar. The first coil 324 comprises one or more wires wrapped in a plurality of layers, three layers shown for illustration, and having a first polarity. The second coil 326 comprises one or more wires wrapped in a plurality of layers, three layers shown for illustration, and having a second polarity. In some embodiments, the first polarity and the second polarity are the same. In some embodiments, the first polarity and the second polarity are opposite (as depicted in FIG. 3C).

In embodiments where two adjacent coils are provided having opposite polarity to form an electromagnetic dipole, such as depicted in FIG. 3C, the first magnetic field may advantageously be localized within the process chamber 104, thus minimizing the impact on any adjacent process chambers. The spacing between the adjacent coils with opposite polarity and the ratio of magnetic fields generated by the two coils allow additional control over the distribution and localization of the first magnetic field in an axisymmetric fashion.

Returning to FIG. 1, in some embodiments, the one or more inner and outer electromagnets 127, 128 may be disposed about between the first and second coils, 110, 112.

In some embodiments either or both of the inner electromagnets 127 and outer electromagnets 128 may be DC electromagnets comprising wires and powered by respective adjustable DC power supplies. The number of turns can vary depending on the wire gauge from few turns to hundreds of turns, such as about 10 turns to about 500 turns. The currents can vary from few tens of mAmps to few to tens of Amps, such as about 50 mAmps to about 20 Amps.

A heater element 121 may be disposed atop the dielectric lid 120 to facilitate heating the interior of the process chamber 104. The heater element 121 may be disposed between the dielectric lid 120 and the first and second coils 110, 112. In some embodiments. the heater element 121 may include a resistive heating element and may be coupled to a power supply 123, such as an AC power supply, configured to provide sufficient energy to control the temperature of the heater element 121 to be between about 50 to about 100 degrees Celsius. In some embodiments, the heater element 121 may be an open break heater. In some embodiments, the heater element 121 may comprise a no break heater, such as an annular element, thus, facilitating uniform plasma formation within the process chamber 104.

During operation, a substrate 114 (such as a semiconductor wafer or other substrate suitable for plasma processing) may be placed on the pedestal 116 and process gases may be supplied from a gas panel 138 through entry ports 126 to form a gaseous mixture 150 within the process chamber 104. The gaseous mixture 150 may be ignited into a plasma 155 in the process chamber 104 by applying power from the plasma source 108 to the first and second coils 110, 112 and optionally, the one or more electrodes (not shown). In some embodiments, power from the bias source 122 may be also provided to the pedestal 116. The pressure within the interior of the chamber 104 may be controlled using a throttle valve 133 and a vacuum pump 136. The temperature of the chamber wall 130 may be controlled using liquid-containing conduits (not shown) that run through the wall 130.

The temperature of the substrate 114 may be controlled by stabilizing a temperature of the support pedestal 116. In one embodiment, helium gas from a gas source 148 may be provided via a gas conduit 149 to channels defined between the backside of the substrate 114 and grooves (not shown) disposed in the pedestal surface. The helium gas is used to facilitate heat transfer between the pedestal 116 and the substrate 114. During processing, the pedestal 116 may be heated by a resistive heater (not shown) within the pedestal to a steady state temperature and the helium gas may facilitate uniform heating of the substrate 114. Using such thermal control, the substrate 114 may illustratively be maintained at a temperature of between 0 and 500 degrees Celsius.

The controller 140 comprises a central processing unit (CPU) 144, a memory 142, and support circuits 146 for the CPU 144 and facilitates control of the components of the reactor 100 and, as such, of methods of forming a plasma, such as discussed herein. The controller 140 may be one of any form of general-purpose computer processor that can be used in an industrial setting for controlling various chambers and sub-processors. The memory, or computer-readable medium, 142 of the CPU 144 may be one or more of readily available memory such as random access memory (RAM), read only memory (ROM), floppy disk, hard disk, or any other form of digital storage, local or remote. The support circuits 446 are coupled to the CPU 144 for supporting the processor in a conventional manner. These circuits include cache, power supplies, clock circuits, input/output circuitry and subsystems, and the like. The memory 142 stores software (source or object code) that may be executed or invoked to control the operation of the reactor 100 in the manner described below. Specifically, memory 142 stores a calibration module 190 that is executed to calibrate the ratio of current or power applied to the coils 110 and 112. The software routine may also be stored and/or executed by a second CPU (not shown) that is remotely located from the hardware being controlled by the CPU 144.

While the foregoing is directed to embodiments of the present disclosure, other and further embodiments of the disclosure may be devised without departing from the basic scope thereof.

The invention claimed is:

1. An apparatus for processing a substrate, comprising:
   a process chamber having an internal processing volume disposed beneath a dielectric lid of the process chamber;
   a substrate support disposed in the process chamber;
   two or more concentric inductive coils disposed above the dielectric lid to inductively couple RF energy into the processing volume above the substrate support; and
   an electromagnetic dipole disposed proximate a top surface of the dielectric lid between two adjacent concentric inductive coils of the two or more concentric inductive coils, wherein the electromagnetic dipole includes at least two electromagnets comprising:
      a first electromagnetic coil of one or more wires wrapped in a first plurality of layers and having a first polarity; and
      a second electromagnetic coil of one or more wires wrapped in a second plurality of layers having a second polarity opposite the first polarity, wherein the second electromagnetic coil is disposed radially outward of the first electromagnetic coil at a first distance; and
   an actuator configured to move at least one of the at least two electromagnets from a first position above the dielectric lid to a second position above the dielectric lid.

2. The apparatus of claim 1, wherein the first distance is about 0.5 inches to about 5 inches.

3. The apparatus of claim 1, wherein the first distance is 1 inch.

4. The apparatus of claim 1, wherein the electromagnetic dipole is configured to form a magnetic field in an area proximate to and below the dielectric lid to enable plasma density tuning.

5. The apparatus of claim 1, wherein the electromagnetic dipole is configured to adjust an impedance in an area proximate to and below the dielectric lid to enable plasma density tuning.

* * * * *